United States Patent
Wu et al.

(10) Patent No.: US 11,031,319 B2
(45) Date of Patent: Jun. 8, 2021

(54) THERMAL INTERFACE MATERIALS WITH ADHESIVE SELANT FOR ELECTRONIC COMPONENTS

(71) Applicant: HEWLETT-PACKARD DEVELOPMENT COMPANY, L.P., Houston, TX (US)

(72) Inventors: Kuan-Ting Wu, Taipei (TW); David A Pipho, Houston, TX (US); Kevin Voss, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/323,090

(22) PCT Filed: Oct. 6, 2016

(86) PCT No.: PCT/US2016/055615
§ 371 (c)(1),
(2) Date: Feb. 4, 2019

(87) PCT Pub. No.: WO2018/067150
PCT Pub. Date: Apr. 12, 2018

(65) Prior Publication Data
US 2019/0221498 A1 Jul. 18, 2019

(51) Int. Cl.
| H01L 23/433 | (2006.01) |
| H01L 21/56 | (2006.01) |
| H01L 23/02 | (2006.01) |
| H01L 23/42 | (2006.01) |
| H01L 21/48 | (2006.01) |
| H01L 23/367 | (2006.01) |

(52) U.S. Cl.
CPC ........ *H01L 23/433* (2013.01); *H01L 21/4871* (2013.01); *H01L 21/56* (2013.01); *H01L 23/02* (2013.01); *H01L 23/42* (2013.01); *H01L 23/3675* (2013.01); *H01L 2224/32245* (2013.01); *H01L 2924/14* (2013.01); *H01L 2924/16251* (2013.01)

(58) Field of Classification Search
CPC .... H01L 23/433; H01L 21/4871; H01L 23/02
See application file for complete search history.

(56) References Cited

U.S. PATENT DOCUMENTS

| 7,005,320 | B2 | 2/2006 | Kwon |
| 7,440,281 | B2 | 10/2008 | Bailey et al. |
| 7,535,714 | B1 | 5/2009 | Sinha |
| 8,211,501 | B2 | 7/2012 | Simion |
| 8,334,591 | B2 | 12/2012 | Kusano |
| 8,703,536 | B2 | 4/2014 | Start et al. |
| 8,981,550 | B2 * | 3/2015 | Park ........................ H01L 23/42 257/675 |
| 9,257,364 | B2 | 2/2016 | Ahuja et al. |
| 10,098,220 | B2 * | 10/2018 | Liang .................. H05K 7/2039 |
| 2001/0050422 | A1 * | 12/2001 | Kishimoto .......... H01L 23/3737 257/678 |

(Continued)

*Primary Examiner* — Quoc D Hoang
(74) *Attorney, Agent, or Firm* — HPI Patent Department

(57) ABSTRACT

In one example, an apparatus is described, which includes an electronic component, a thermal dissipation unit, a thermal interface material disposed between the electronic component and the thermal dissipation unit, and an adhesive sealant applied around the thermal interface material between the electronic component and the thermal dissipation unit.

10 Claims, 3 Drawing Sheets

(56) References Cited

U.S. PATENT DOCUMENTS

| | | |
|---|---|---|
| 2004/0124526 A1 | 7/2004 | Matayabas, Jr. |
| 2007/0127211 A1* | 6/2007 | Macris .................... H01L 23/42 |
| | | 361/700 |
| 2008/0137300 A1* | 6/2008 | Macris .................... H01L 23/10 |
| | | 361/699 |
| 2014/0264815 A1* | 9/2014 | Yew .................... H01L 23/4334 |
| | | 257/704 |
| 2015/0334871 A1 | 11/2015 | Hill et al. |

* cited by examiner

THERMAL INTERFACE MATERIALS WITH ADHESIVE SELANT FOR ELECTRONIC COMPONENTS

BACKGROUND

Electronic components, such as integrated circuits, may be assembled into component packages by physically and electrically coupling them to a substrate. During operation, a package may generate heat which can be dissipated to help maintain the circuitry at a desired temperature. Example package may include at least one electronic component such as a die, processor and/or the like. Heat sink may be coupled to the package using a suitable thermal interface to assist in transferring the heat from the package to the heat sink. For example, a thermal interface material (TIM) may be sandwiched or placed between a processor and a heat sink to facilitate or enhance heat transfer between the processor and the heat sink.

BRIEF DESCRIPTION OF THE DRAWINGS

Examples are described in the following detailed description and in reference to the drawings, in which.

DETAILED DESCRIPTION

Figure 1:
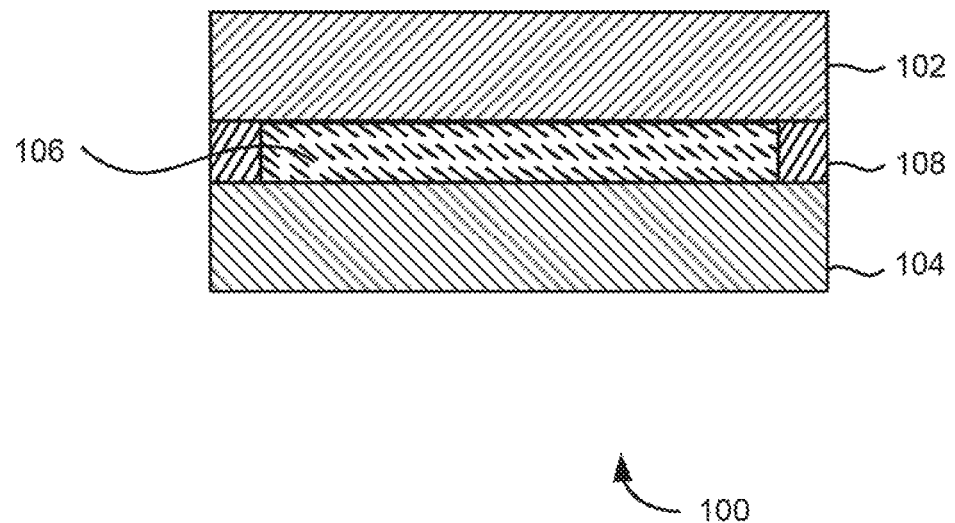
FIG. 1 is a cross-sectional view of an example apparatus, according to one aspect of the present subject matter.

As electronic devices become more powerful and are supplied in ever smaller packages, electronic components in these devices have become smaller and more densely packed on integrated circuit boards. To ensure that the electronic device operates reliably, heat generated by these components should be efficiently dissipated. For example, to enhance conductive cooling, electronic components may utilize a thermal management material as a heat transfer interface between mating surfaces of a heat generating electronic component, such as an integrated circuit chip/processor, and a thermal dissipation member such as a heat sink or a finned heat spreader. These thermal management materials positioned at heat transfer interfaces are designed to substantially eliminate insulating air between the electronic component and the thermal dissipation member, which enhances heat transfer efficiency.

The thermal interface material may perform the functions of eliminating at least some interstitial air pockets and enhance contact between the electronic component (e.g., processor) and the heat sink. Thermal interface materials, however, may suffer from migration over time. For example, some thermal interface materials may tend to move away from thermal joints with time, flowing or otherwise migrating out from the heat transfer surface area of the processor and/or heat sink. For example, corrosion may take place at the interface of the processor and the heat sink. As the thermal interface material migrates, air pockets may form in the thermal joint, and rate of conductive heat transfer between the electronic component and heat sink may drop.

Examples described herein may utilize amorphous metal as thermal interface material between an electronic component and a thermal dissipation unit (e.g., heat sink) to enhance heat transfer from the electronic component. Further, an adhesive sealant may be applied to seal the amorphous metal between the electronic component and thermal dissipation unit to eliminate corrosion risk at an interface of electronic component and heat sink. In one example, the electronic component may be attached to the heat sink by disposing a thermal interface material between the electronic component and the heat sink and then the adhesive sealant may be applied to seal the thermal interface material between the electronic component and the heat sink.

Examples described herein may enable to maintain power efficiency by effective heat dissipation of amorphous metal thermal interface material/layer. For example, usage of amorphous metal as thermal interface material may enhance heat dissipation rate (e.g., 15-28 W/mK) when compared to using thermal grease as thermal interface material (e.g., 0.5-2 W/mK). Examples described herein may use adhesive sealant such as rubber adhesives to eliminate corrosion risk and resist dimension change due to environmental temperature changes.

Examples described herein may extend product lifetime such as liquid crystal display (LCD) panel, light-emitting diode (LED), central processing unit (CPU) and battery lifetime. Examples described herein may reduce the risk of battery explosion. Examples described herein may prevent/reduce electronic components from overheat, thereby reducing skin burning issues of a user. Examples described herein may improve information loading speed and power efficiency. Examples described herein may apply thermal solutions for electronic devices such as a notebook, tablet personal computer (PC), smart phone, television, and the like.

In the following description, for purposes of explanation, numerous specific details are set forth in order to provide a thorough understanding of the present techniques. It will be apparent, however, to one skilled in the art that the present apparatus, devices and systems may be practiced without these specific details. Reference in the specification to "an example" or similar language means that a particular feature, structure, or characteristic described is included in at least that one example, but not necessarily in other examples.

Turning now to the figures, FIG. 1 is a cross-sectional view of an example apparatus 100. Apparatus 100 may include an electronic component 104, a thermal dissipation unit 102 and a thermal interface material 106 disposed between electronic component 104 and thermal dissipation unit 102. Electronic component 104 may generate heat during operation. Example electronic component 104 may include, but not limited to, a central processing unit (CPU), a graphics processor, a memory element, a display panel, a printed circuit board, means for wireless data exchange, sensors and/or any other such heat generating components/devices. In one example, electronic components can be housed in an electronic device such as a notebook, tablet personal computer (PC), smart phone, audio and video devices (e.g., stereo equipment and televisions), and the like.

Example thermal dissipation unit 102 may include a heat sink or a heat spreader to conduct heat away from electronic component 104. In some examples, thermal interface material 106 may be deposited on a surface of electronic component 104 and/or thermal dissipation unit 102, and then thermal dissipation unit 102 may be attached to electronic component 104 with thermal interface material 106 deposited there between.

In one example, thermal interface material 106 may include a liquid metal capable of forming a transient liquid phase bond between electronic component 104 and thermal dissipation unit 102. Example thermal interface material 106 may include an amorphous metal composition selected from the group consisting of gallium, indium, tin, and zinc. In some examples, amorphous metal (e.g., liquid metal) may be able to fill up the uneven gaps between electronic component 104 and thermal dissipation unit 102 due to its malleability at specified temperature threshold, thus improving the efficiency of thermal conduction and ensuring that the heat transfer is performed at the maximum bandwidth.

Further, apparatus 100 may include an adhesive sealant 108 applied around thermal interface material 106 between electronic component 104 and thermal dissipation unit 102. Example adhesive sealant 108 may be made up of at least one material selected from the group consisting of neoprene, ethylene-propylene-diene, silicone, natural rubber, carboxylated nitrile, hydrogenated nitrile, fluoro-silicone, urethane, hexafluoropropylene-vinylidene fluoride, isoprene, isobutene-isoprene, styrene-butadiene, polysiloxane, nitrile-butadiene, and rubber-based adhesives. For example, silicone rubber may be generally non-reactive, stable, and resistant to extreme environments and temperatures (e.g., from −55° C. to +300° C.) while maintaining useful properties.

In one example, adhesive sealant 108 may include at least one thermally conductive material selected from the group consisting of graphene, carbon nanotube, graphite, aluminium, copper, silver, silicon, gold, diamond, and synthetic thermal conductive materials. In some examples, adhesive sealant 108 may include a combination of adhesives and thermally conductive materials. Adhesive sealant 108 may eliminate corrosion risk at an interface of electronic component 104 and thermal dissipation unit 102. An example electronic assembly of a heat sink and a processor is explained in FIG. 2.

Figure 2:
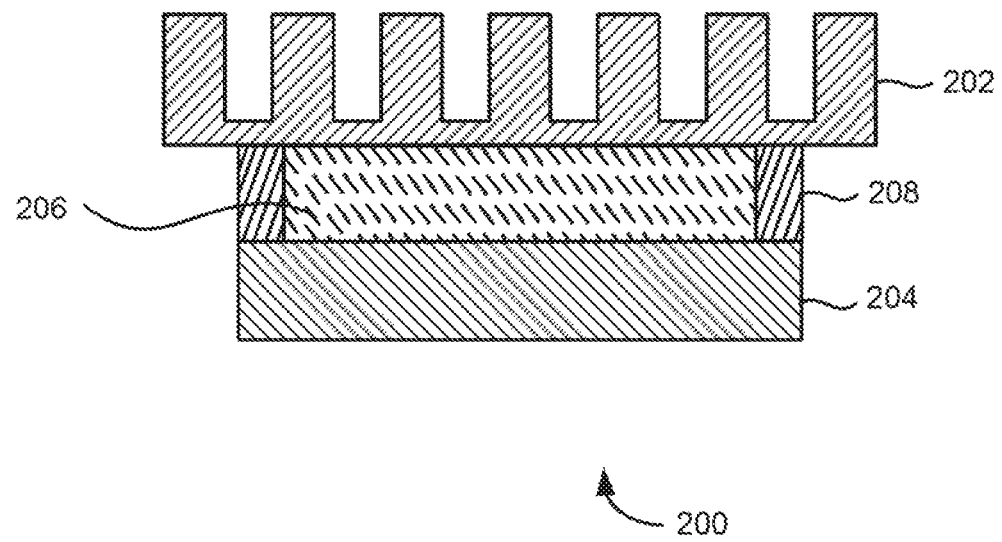
FIG. 2 is a cross-sectional view of an example electronic assembly depicting a heat sink coupled to a processor, according to one aspect of the present subject matter.

FIG. 2 is a cross-sectional view of an example electronic assembly 200 depicting a heat sink 202 coupled to a processor 204 (e.g., central processing unit). Example processor may be a dedicated graphics processor, a central processing unit, a memory processor, and the like. In the example shown in FIG. 2, processor 204 may be attached to heat sink 202 by disposing an amorphous metal 206 (i.e., thermal interface material) there between. Further, an adhesive sealant 208, such as silicon rubber, may be sealed around a periphery of amorphous metal 206. In this case, adhesive sealant 208 may form an interface between processor 204 and heat sink 202. In some examples, adhesive sealant 208 may include a thermally conductive material to enhance heat transfer between processor 204 and heat sink 202.

For example, amorphous metal 206 may enhance heat transfer at hot spot areas. However, corrosion of amorphous metal 206 may take place at the interface of processor 204 and heat sink 202. To prevent/eliminate corrosion, the silicon rubber or other combinations of materials may be used as adhesive sealant 208 to seal amorphous metal 206 between processor 204 and heat sink 202. In one example, adhesive sealant 208 may ensure the dimension stability of outer periphery of amorphous metal 206 by retaining amorphous metal 206 within the sealed portion between processor 204 and heat sink 202.

Figure 3A:
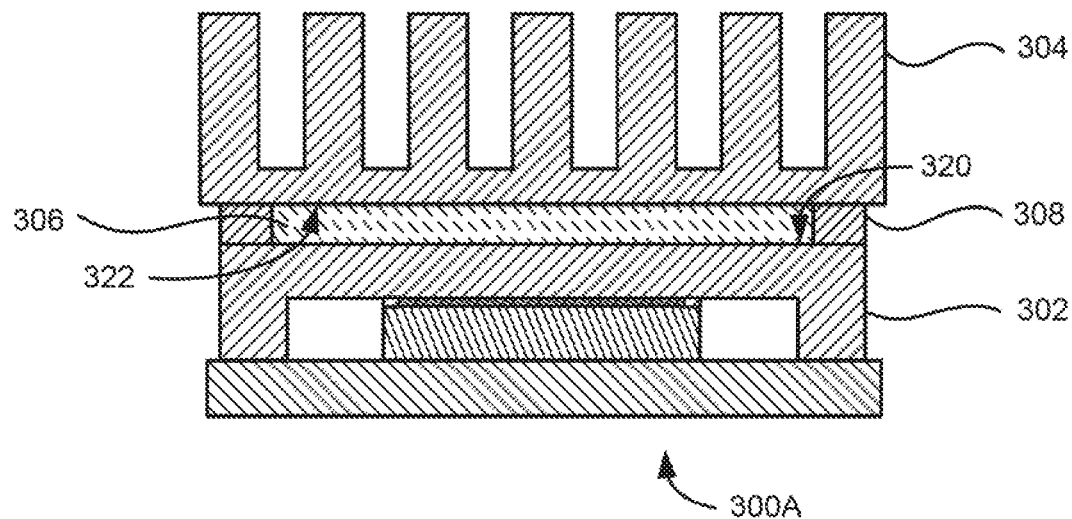
FIGS. 3A and 3B depict cross-sectional views of another example electronic assembly, according to one aspect of the present subject matter.
Figure 3B:
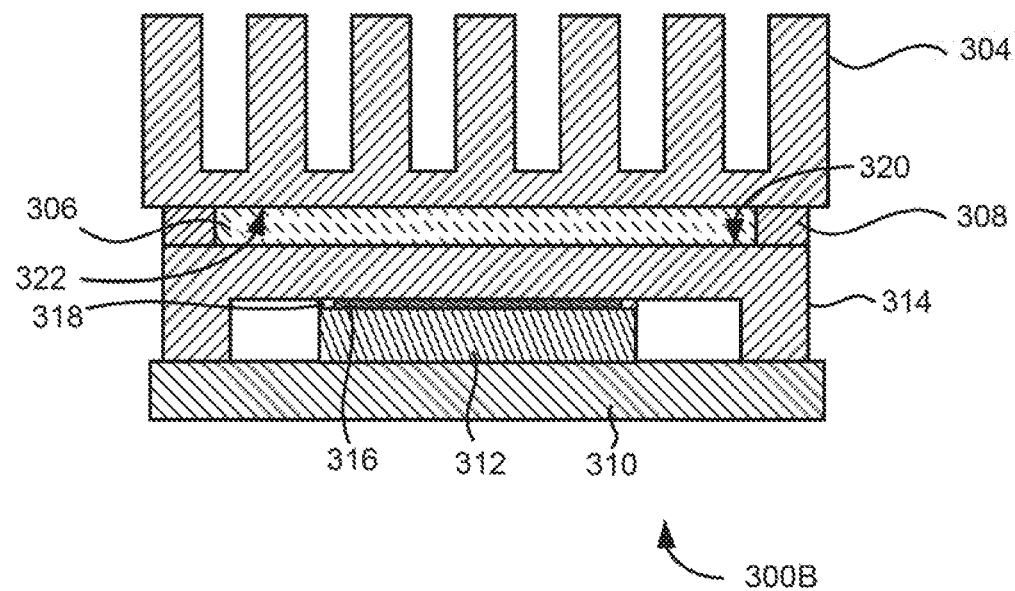

Even though electronic assemblies 100 and 200 of FIGS. 1 and 2, respectively, describe about an electronic component attached to a thermal dissipation unit, electronic assemblies can also include an integrated circuit package that is attached to a heat sink as shown in FIGS. 3A and 3B. Integrated circuit package may be soldered or plugged into a motherboard of an electronic device.

As shown in FIGS. 3A and 3B, an electronic assembly 300 may include an integrated circuit package 302 including a first surface 320, a heat sink 304 including a second surface 322, and a thermal interface material 306 interposed in a gap between first surface 320 and second surface 322. Example thermal interface material 306 may include an amorphous metal composition selected from the group consisting of gallium, indium, tin, and zinc. Integrated circuit package 302 may be thermally connected to heat sink 304 by thermal interface material 306.

Further, electronic assembly 300 may include an adhesive sealant 308 applied around thermal interface material 306 such that adhesive sealant 308 may be interfaced between first surface 320 and second surface 322. Example adhesive sealant 308 may be made up of at least one material selected from the group consisting of neoprene, ethylene-propylene-diene, silicone, natural rubber, carboxylated nitrile, hydrogenated nitrile, fluoro-silicone, urethane, hexafluoropropylene-vinylidene fluoride, isoprene, isobutene-isoprene, styrene-butadiene, polysiloxane, nitrile-butadiene, and rubber-based adhesives. Further, adhesive sealant 308 may include at least one thermally conductive material selected from the group of graphene, carbon nanotube, graphite, aluminium, copper, silver, silicon, gold, diamond, and synthetic thermal conductive materials. Example integrated circuit package is explained in detail in FIG. 3B.

As shown in FIG. 3B, integrated circuit package 302 may include a substrate 310, a die/chip 312 attached to substrate 310, and a heat spreader 314. Example substrate 310 may be, for example, a printed circuit board (PCB) or other type of circuit board, integrated circuit or system-on-chip design, breadboard, stripboard, or any other electrical component. In one example, heat spreader 314 and substrate 310 may be sealed together to enclose die/chip 312 and a thermal interface material 316. In another example, a lid/cap and substrate 310 can be sealed together to enclose die/chip 312 and thermal interface material 316. In some examples, the lid may include heat spreader 314 to facilitate spreading of the heat from chip 312 to heat sink 304. Further, thermal interface material 316 may be disposed between die 312 and heat spreader 314. Furthermore, an adhesive sealant 318 can be applied around thermal interface material 316 and interfaced between integrated heat spreader 314 and die/chip 312.

In one example, integrated heat spreader 314 may include first surface 320 (i.e., at confronting side of die/chip 312) to conduct heat generated from die/chip 312. During operation, thermal conduction of heat from die/chip 312 to heat spreader 314 may be performed through thermal interface material 316 and adhesive sealant 318. Further, the heat conducted from heat spreader 314 may be transferred to heat sink 304 through thermal interface material 306 and adhesive sealant 308 that is applied around thermal interface material 306.

Figure 4:
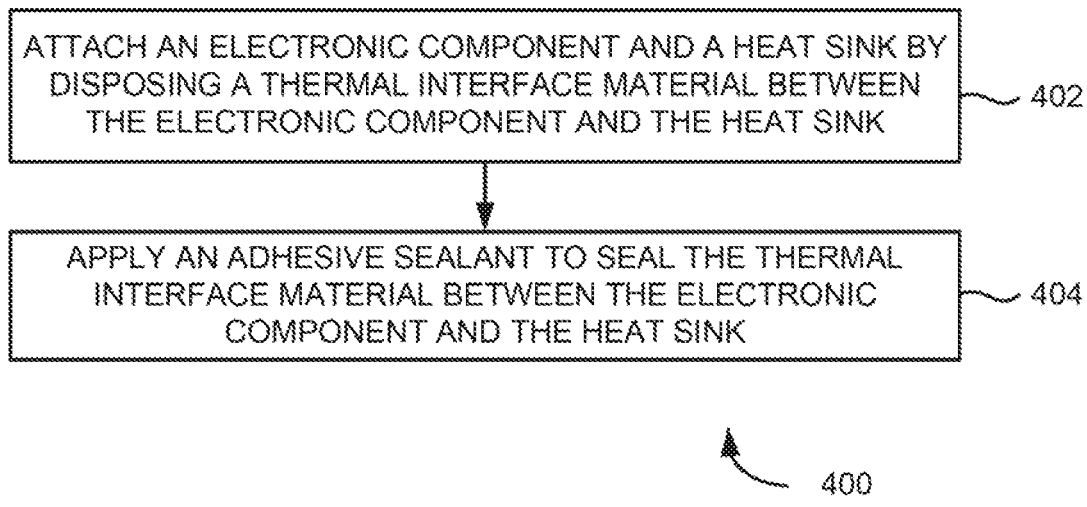
FIGS. 4 and 5 depict flow charts illustrating example methods for forming an electronic assembly, according to one aspect of the present subject matter.

FIG. 4 depicts a flow chart 400 illustrating an example method for forming an electronic assembly. At 402, an electronic component and a heat sink may be attached by disposing a thermal interface material between the electronic component and the heat sink. In one example, thermal interface material may form an interface between the electronic component and the heat sink. At 404, an adhesive sealant may be applied to seal the thermal interface material between the electronic component and the heat sink.

Figure 5:
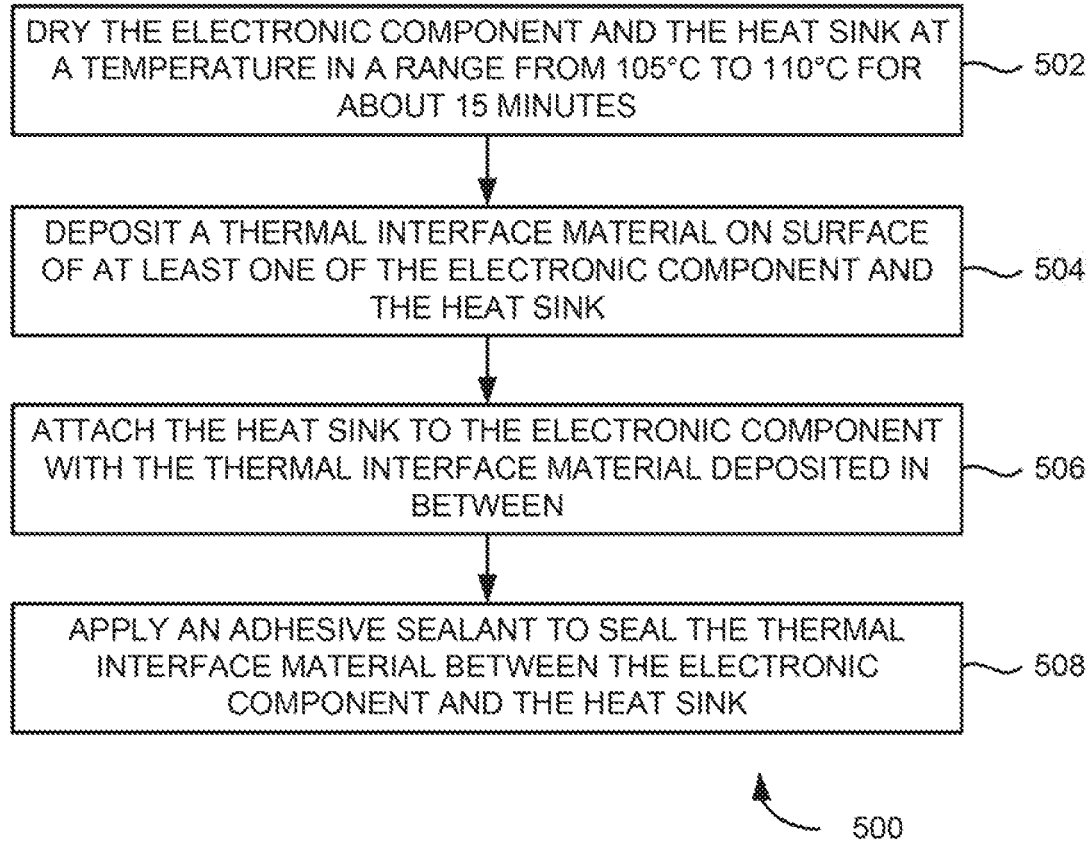

FIG. 5 depicts a flow chart 500 illustrating additional details for forming the electronic assembly of FIG. 4. At

502, the electronic component and the heat sink may be dried at a temperature in a range from 105° C. to 110° C. for about 15 minutes. At 504, the thermal interface material may be deposited on a surface of the electronic component and/or the heat sink. In one example, the thermal interface material may include a liquid metal capable of forming a transient liquid phase bond. At 506, the heat sink may be attached to the electronic component with the thermal interface material deposited in between.

At 508, an adhesive sealant may be applied to seal the thermal interface material between the electronic component and the heat sink. In one example, the adhesive sealant may be applied around the thermal interface material by coating along a periphery/outer boundary of the thermal interface material. Example, adhesive sealant may be made up of at least one material selected from the group consisting of neoprene, ethylene-propylene-diene, silicone, natural rubber, carboxylated nitrile, hydrogenated nitrile, fluoro-silicone, urethane, hexafluoropropylene-vinylidene fluoride, isoprene, isobutene-isoprene, styrene-butadiene, polysiloxane, nitrile-butadiene, and rubber-based adhesives. Further, the adhesive sealant may include at least one thermally conductive material.

Examples described herein may be used in any number of exemplary environments, networks, telephony systems or computer systems, and implemented on a wide variety of computer, network or telephony hardware (for example, the aforementioned boards or cards) and with any of a number of different types of processors. As yet another example, a smart card having an internal processor may employ the examples described herein. Further, example operating environments in which examples described herein may operate or be found include personal computers, network servers, microcomputers, minicomputers, desktop computers, notebook computers, mobile telephones, personal computing or scheduling devices, personal communication devices, switches, routers, tablet computing devices, digital entertainment devices such as MPEG Layer-3 (MP3) players or cameras, and the like. Examples described herein may be used in any electronic environment having a need to efficiently transfer heat from one surface to another.

It may be noted that the above-described examples of the present solution are for the purpose of illustration only. Although the solution has been described in conjunction with a specific embodiment thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on", as used herein, means "based at least in part on." Thus, a feature that is described as based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. A method of forming an electronic assembly, comprising:
   depositing a thermal interface material on a surface of an electronic component, wherein the thermal interface material comprises a liquid metal;
   bonding the electronic component and a heat sink by disposing the thermal interface material between the electronic component and the heat sink;
   applying an adhesive sealant to seal the thermal interface material between the electronic component and the heat sink, wherein the adhesive sealant is in contact with the thermal interface material and is configured to provide dimensional stability to the thermal interface material, and
   prior to depositing the thermal interface material on the surface of at least one of the electronic component or the heat sink, drying the electronic component and the heat sink with heat.

2. The method of claim 1, wherein the liquid metal is capable of forming a transient liquid phase bond.

3. The method of claim 2,
   wherein drying the electronic component and the heat sink with heat is carried out at a temperature in a range from 105° C. to 110° C. for about 15 minutes.

4. The method of claim 1, wherein the adhesive sealant is applied around the thermal interface material by coating along a periphery of the thermal interface material, and wherein the adhesive sealant is made up of at least one material selected from the group consisting of neoprene, ethylene-propylene-diene, silicone, natural rubber, carhoxylated nitrile, hydrogenated nitrile, fluoro-silicone, urethane, hexafluoropropylene-vinylidene fluoride, isoprene, isobutene-isoprene, styrene-butadiene, polysiloxane, nitrile-butadiene, and rubber-based adhesives.

5. A method of forming an electronic assembly, comprising:
   attaching an electronic component and a heat sink by disposing a thermal interface material between the electronic component and the heat sink, wherein attaching the electronic component and the heat sink comprises:
   depositing the thermal interface material on a surface of at least one of the electronic component and the heat sink, wherein the thermal interface material comprises a liquid metal capable of forming a transient liquid phase bond, and
   attaching the heat sink to the electronic component with the thermal interface material deposited in between;
   drying the electronic component and the heat sink with heat prior to depositing the thermal interface material on the surface of at least one of the electronic component and the heat sink; and
   applying an adhesive sealant to seal the thermal interface material between the electronic component and the heat sink.

6. The method of claim 5, wherein the adhesive sealant is applied around the thermal interface material by coating along a periphery of the thermal interface material.

7. The method of claim 5, wherein the thermal interface material comprises an amorphous metal composition selected from the group consisting of gallium, indium, tin, and zinc.

8. The method of claim 5, wherein the adhesive sealant is made up of at least one adhesive selected from the group consisting of neoprene, ethylene-propylene-diene, silicone, natural rubber, carboxylated nitrile, hydrogenated nitrile, fluoro-silicone, urethane, hexafluoropropylene-vinylidene fluoride, isoprene, isobutene-isoprene, styrene-butadiene, polysiloxane, nitrile-butadiene, and rubber-based adhesives; or wherein the adhesive sealant comprises at least one thermally conductive material selected from the group of graphene, carbon nanotube, graphite, aluminium, copper, silver, silicon, gold, diamond, and synthetic thermal conductive materials; or both.

9. The method of claim 5, wherein the adhesive sealant comprises a combination of adhesives and thermally conductive materials, and wherein a thermal dissipation unit comprises one of the heat sink or a heat spreader.

10. The method of claim 5, wherein drying the electronic component or the heat sink with heat is carried out at a temperature in a range from 105° C. to 110° C. for about 15 minutes.

* * * * *